United States Patent [19]

Gagliani

[11] 4,135,160
[45] Jan. 16, 1979

[54] PULSE WIDTH NORMALIZER

[75] Inventor: Laurence O. Gagliani, Aloha, Oreg.

[73] Assignee: Tektronix, Inc., Beaverton, Oreg.

[21] Appl. No.: 801,179

[22] Filed: May 27, 1977

[51] Int. Cl.$^2$ .................................................. H03K 1/18
[52] U.S. Cl. ..................................... 328/58; 307/265; 328/111
[58] Field of Search ............... 307/265, 267, 358; 328/58, 111; 333/20

[56] References Cited

U.S. PATENT DOCUMENTS

| | | | |
|---|---|---|---|
| 2,784,310 | 3/1957 | Cowan | 328/111 |
| 3,274,821 | 9/1966 | Weighart | 328/58 |
| 3,299,271 | 1/1967 | Stites | 307/358 |
| 3,381,228 | 4/1968 | Vanhove | 328/58 |
| 3,532,905 | 10/1970 | Zijta et al. | 307/265 |
| 3,763,436 | 10/1973 | Haw | 307/358 |

*Primary Examiner*—Larry N. Anagnos
*Assistant Examiner*—B. P. Davis
*Attorney, Agent, or Firm*—George T. Noe

[57] ABSTRACT

A pulse width normalizer circuit incorporates a delay line to ensure a predetermined minimum pulse width output when input pulses become narrower than the predetermined minimum width. One output and one input of a differential amplifier are coupled to a delay line having a predetermined length and a shorted opposite end. An input pulse is applied to the other input of the differential amplifier, causing the outputs to switch to thereby produce an output pulse. The differential amplifier remains latched for the time it takes the leading edge of the output pulse to propagate down the delay line and back.

3 Claims, 7 Drawing Figures

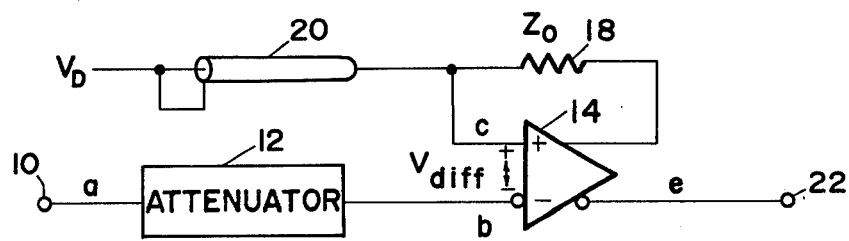
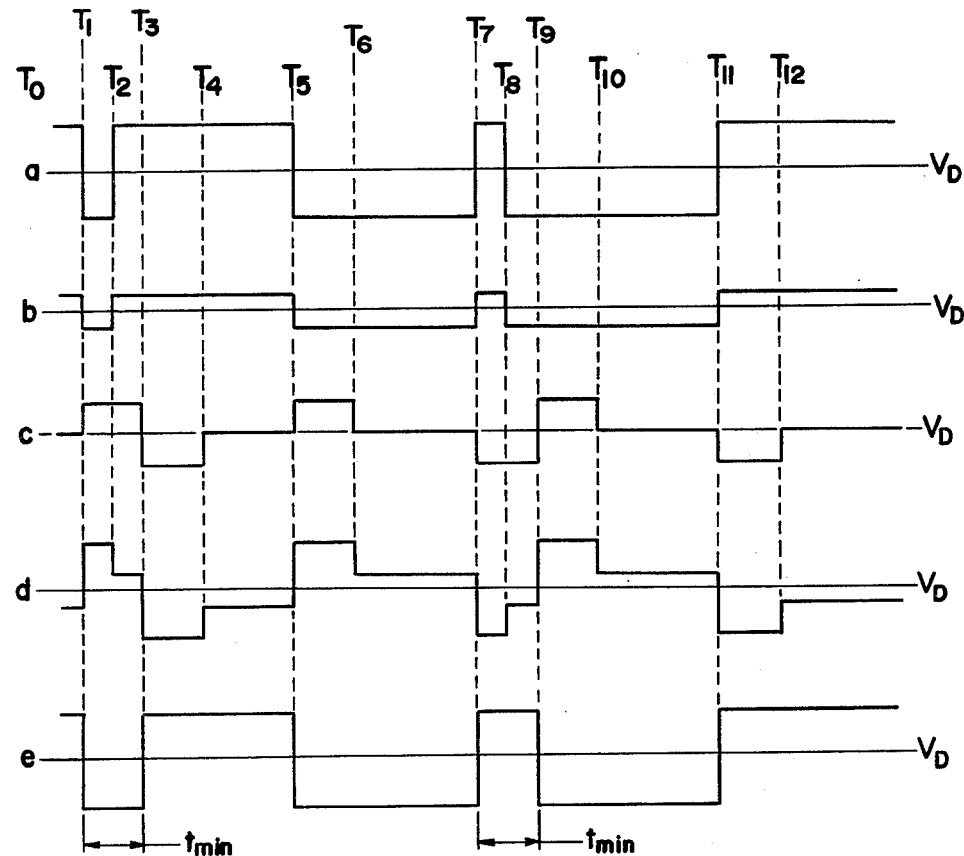
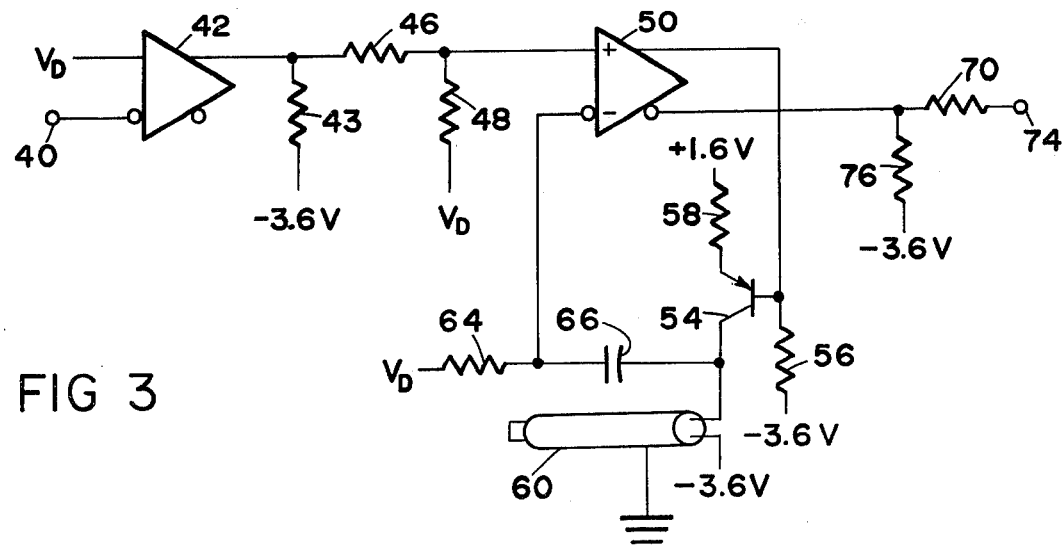

PULSE WIDTH NORMALIZER

BACKGROUND OF THE INVENTION

Pulse processing circuits are widely used in data transmission systems, computers, and associated equipment. These circuits typically comprise active components of a given "logic family," for example, transistor-transistor logic (TTL), emitter-coupled logic (ECL), etc. Each logic family has its own features and operating characteristics, and while generally a particular logic family is utilized in a given processing circuit, it would sometimes be desirable for such a family to be compatible with other logic families. However, one major problem that makes such compatibility difficult is that different logic families have different operating speeds, and specifically, the minimum pulse width to which a logic family will completely respond is an operational limit.

Various pulse-stretching techniques have been utilized to provide pulse normalizers which stretch the output pulses from logic families having high-speed switching characteristics so that such output pulses are within the operational limits of logic families having low-speed switching characteristics. Such prior art pulse normalizers typically include RC or LC timing circuits. However, because the transfer functions of these circuits are exponential, inherent recovery or "memory" problems exist therein, resulting in erroneous or faulty manipulation of data. Further, separate circuits have been required for each positive and negative polarity inputs, resulting in matching errors. Another problem incurred by prior art pulse normalizers is that pulses which are wider than the minimum width required are also stretched, causing unpredictable operation.

SUMMARY OF THE INVENTION

In accordance with the present invention, the standardized minimum width output pulse of a pulse normalizer is determined by the very stable physical parameter of delay line length, overcoming the problems mentioned hereinabove.

A delay line having a predetermined length has one end shorted and the other end coupled to one input and one output of a differential amplifier to latch the differential amplifier output in a particular state for the length of time it takes the leading edge of an input pulse to propagate down the delay line and back. The latching action is released at the end of the total propagation time of the delay line, so substantially no further stretching is incurred for pulses which are wider than the standard minimum pulse width required by subsequent processing circuits. The circuit responds well for either positive-going or negative-going transitions, precluding the necessity of a separate circuit for each polarity input.

It is therefore one object of the present invention to provide a novel pulse width normalizer circuit.

It is another object to provide a pulse width normalizer circuit in which the minimum pulse width is determined by a delay line.

It is a further object to provide a pulse width normalizer circuit which is equally responsive to either positive or negative pulses.

It is an additional object to provide a simple and inexpensive pulse width normalizer circuit having very stable and predictable timing characteristics.

Other objects and attainments of the present invention will become apparent to those skilled in the art upon a reading of the following detailed description when taken in conjunction with the drawings.

BRIEF DESCRIPTION OF THE DRAWINGS

FIG. 1 shows a simplified schematic of a pulse width normalizer circuit in accordance with the present invention;

FIGS. 2a through 2e show the timing and condition relationships of waveforms present in the circuit of FIG. 1; and FIG. 3 shows a detailed schematic of a commercial embodiment of a pulse width normalizer circuit in accordance with the present invention.

DETAILED DESCRIPTION OF THE INVENTION

Referring to FIG. 1, a simplified schematic of a pulse width normalizer is shown. Input pulses, which may be encoded digital signals, are applied to an input terminal 10 and then are attenuated by an attenuator 12 before being applied to the inverting input of a differential amplifier 14. Differential amplifiers of the type shown are well known in the art and are available in the form of integrated circuits; therefore, no discussion will be made of the internal circuitry therein. The small circles adjacent one input and one output indicate an in-phase relationship of input and output pulses.

The non-inverting input is connected to its in-phase output through a resistor 18, and to a source of bias voltage $V_D$ through a delay line 20, whose output end is shorted to ensure complete reflection of any pulses traveling down the delay line. Delay line 20 suitably may be a coaxial cable or other transmission line having a predetermined propagation length. The value of resistor 18 is chosen to properly terminate the delay line. Output pulses from the circuit are available to subsequent processing circuits via an output terminal 22.

Operation of the circuit of FIG. 1 can best be understood in connection with the waveforms of FIGS. 2a through 2e. Waveform a of FIG. 2a is an encoded digital input signal showing various pulse polarities and widths. Waveform b of FIG. 2b is the attenuated input signal applied to the inverting input of differential amplifier 14. Waveform c of FIG. 2c is the signal at the non-inverting input of differential amplifier 14, and waveform d of FIG. 2d is the difference voltage of the two waveforms applied to differential amplifier 14, or $d = c - b$. Waveform e of FIG. 2e is the output signal. All of the waveforms shown are taken with respect to the decision voltage, $V_D$, which is the average or median level between the high and low logic states.

In the example shown, the input and output logic states are high at $T_o$, and the non-inverting input of differential amplifier 14 is quiescently biased to $V_D$. At time $T_1$, the input signal makes a negative-going transition, forcing the output signal low. A positive-going transition is coupled through resistor 18 to the non-inverting input and to the delay line 20. At time $T_2$, the input signal makes a positive-going transition. Note, however, that waveform c remains high while the leading edge continues to propagate along delay line 20, latching the output signal at the low logic state. Waveform b has been sufficiently attenuated so that its positive-going transition is less than that required to surpass the positive level at the non-inverting input to cause the differential amplifier to switch at time $T_2$. This can be seen graphically in waveform d, which fails to reach the decision level $V_D$ at time $T_2$. At time $T_3$, the timing established by the delay line is completed, and waveform c starts negative, causing the output to switch, producing a positive-going transition at output terminal 22. Of course, a negative-going edge is coupled through resistor 18, causing waveform c to go negative for a timing cycle between $T_3$ and $T_4$; however, this has no effect on the output. The important fact to be discerned from these waveforms is that input waveform a has been stretched to produce output waveform e, whose width $t_{min}$ is the minimum required for manipulation by subsequent processing circuits of perhaps another logic family.

When the input signal is of greater width than $t_{min}$, waveform c goes through a timing cycle as shown between times $T_5$ and $T_6$; however, after completion of such timing cycle, differential amplifier 14 functions as a buffer amplifier and at time $T_7$ the output follows the input without incurring any substantial delays, other than expected gate propagation delays.

The action and timing of the waveforms between times $T_7$ and $T_{12}$ are substantially the same as described for the sequence $T_1$ to $T_6$, except that the polarities are reversed.

From the foregoing description, it can be seen that pulses which are narrower than a predetermined width $t_{min}$ are stretched to meet the minimum width requirements, while pulses that are wider than $t_{min}$ are passed substantially unchanged. Further, the circuit operates equally well on both positive and negative pulses.

FIG. 3 shows a detailed schematic of a commercial embodiment. In this particular application, it is desired to ensure that high-speed input pulses on the order of 3 or 4 nanoseconds pulse width are stretched to a 10-nanosecond width for processing by a TTL logic family of components. The input signal in the form of pulses is applied via input terminal 40 to the inverting input of buffer amplifier 42. The non-inverting input is biased at the decision voltage $V_D$. Resistor 43 is an emitter pull-down resistor for the amplifier. Resistors 46 and 48 form an attenuator to reduce the output signal from amplifier 42 to a predetermined maximum peak-to-peak level. The signal is then applied to the non-inverting input of differential amplifier 50. The non-inverting input is utilized because a phase inversion has taken place through amplifier 42.

The in-phase output of differential amplifier 50 is applied to the base of transistor switch 54, which is biased by resistors 56 and 58. Transistor switch 54 performs the necessary phase inversion for coupling the signal to inverting input of differential amplifier 50. Delay line 60 in this application is a bifilar type transmission line having twisted wire pairs such as those utilized in the vertical amplifier delay lines in oscilloscopes. The differential amplifier and transistor have a total propagation delay of 5 nanoseconds, so the delay line is trimmed to a 5-nanosecond delay to provide the desired overall delay of 10 nanoseconds.

The inverting input of differential amplifier 50 is biased to $V_D$ through a resistor 64, which also provides the proper termination for delay line 60. Capacitor 66 is interposed as a DC blocking capacitor between the collector of transistor 54 and differential amplifier 50, and is sufficiently large that it has no effect on the delay.

The output of the circuit is provided through resistor 70 to an output terminal 74. Resistor 76 is an emitter pull-down resistor for differential amplifier 50.

Operation of the circuit of FIG. 3 is substantially the same as described hereinabove for FIG. 1, and the same principles apply.

It will, therefore, be appreciated that the aforementioned and other desirable objects have been achieved; however, it should be noted that the particular embodiment of the invention, which is shown and described herein, is intended as merely illustrative and not as restrictive of the invention.

I claim:
1. A pulse width normalizer circuit, comprising:
    a differential amplifier having a signal input for receiving input pulses, a reference input, and a pair of outputs; and
    circuit means coupled to said amplifier for latching said amplifier for a predetermined time period after receipt of an input pulse, said circuit means including a delay line having one end thereof coupled to said reference input, the other end of said delay line being shorted so that signals propagating therealong are reflected, said circuit means further including means for coupling one of said outputs to said reference input and to said delay line.
2. A pulse width normalizer circuit in accordance with claim 1 where said delay line has a predetermined length, and said circuit means further includes inpedance means coupled to said reference input for terminating said delay line.
3. A pulse width normalizer circuit in accordance with claim 1 further including an attenuator coupled to said signal input.

* * * * *